United States Patent
Hansen (10) Patent No.: US 10,353,112 B2
(45) Date of Patent: Jul. 16, 2019

(54) METHOD OF ESTIMATING WELL PRODUCTIVITY ALONG A SECTION OF A WELLBORE

(71) Applicant: Maersk Olie og Gas A/S, Kobenhavn K (DK)

(72) Inventor: Jens Henrik Hansen, Kobenhavn K (DK)

(73) Assignee: TOTAL E&P DANMARK A/S, København Ø (DK)

(*) Notice: Subject to any disclaimer, the term of this patent is extended or adjusted under 35 U.S.C. 154(b) by 0 days.

(21) Appl. No.: 15/327,220

(22) PCT Filed: Jun. 4, 2015

(86) PCT No.: PCT/EP2015/062513
§ 371 (c)(1),
(2) Date: Jan. 18, 2017

(87) PCT Pub. No.: WO2015/185696
PCT Pub. Date: Dec. 10, 2015

(65) Prior Publication Data
US 2017/0153358 A1 Jun. 1, 2017

(30) Foreign Application Priority Data
Jun. 6, 2014 (GB) .................................. 1410050.7

(51) Int. Cl.
*G01V 99/00* (2009.01)
*E21B 41/00* (2006.01)
(Continued)

(52) U.S. Cl.
CPC ............ *G01V 99/005* (2013.01); *E21B 41/00* (2013.01); *E21B 41/0092* (2013.01);
(Continued)

(58) Field of Classification Search
CPC ......................... G01V 99/005; E21B 41/0092
(Continued)

(56) References Cited

U.S. PATENT DOCUMENTS

| 2005/0149264 A1 | 7/2005 | Tarvin et al. |
| 2010/0082258 A1 | 4/2010 | Wang |

(Continued)

FOREIGN PATENT DOCUMENTS

| EP | 2504527 A2 | 10/2012 |
| WO | 2004076815 A1 | 9/2004 |

(Continued)

OTHER PUBLICATIONS

Search Report for Danish Application No. PA 201770009, completed Nov. 24, 2017.

(Continued)

*Primary Examiner* — Ricky Ngon
(74) *Attorney, Agent, or Firm* — Brinks Gilson & Lione (57) ABSTRACT

Disclosed is a system and a method of estimating a well inflow profile along a section of a wellbore of a well passing through a formation. The method comprises: collecting field data as a function of time during testing of the well, analyzing the collected field data to obtain selected field parameters, providing a created dynamic simulation model of the well inflow profile of the well based on at least the geometry of the well, defining a number of different possible inflow profile scenarios, simulating the defined inflow profile scenarios by means of the dynamic simulation model, analyzing the simulated inflow profile scenarios to obtain characteristics of intermittent or slug flow behavior in the form of selected modelling parameters as a function of time, comparing the selected modelling parameters as a function of time for each inflow profile scenario to the corresponding selected field parameters as a function of time and identi- (Continued)

fying the most likely inflow profile scenario on the basis thereof, and estimating the well inflow profile along the section of the wellbore based on the comparison of the selected modelling parameters as a function of time to the corresponding selected field parameters as a function of time.

16 Claims, 8 Drawing Sheets

(51) Int. Cl.
*E21B 49/00* (2006.01)
*E21B 47/00* (2012.01)
*E21B 47/06* (2012.01)
*G01V 9/00* (2006.01)
*G06F 17/50* (2006.01)

(52) U.S. Cl.
CPC .......... *E21B 47/0007* (2013.01); *E21B 47/06* (2013.01); *E21B 47/065* (2013.01); *E21B 49/00* (2013.01); *E21B 49/008* (2013.01); *G01V 9/005* (2013.01); *G06F 17/5009* (2013.01)

(58) Field of Classification Search
USPC .......................................................... 702/12
See application file for complete search history.

(56) References Cited

U.S. PATENT DOCUMENTS

| | | | |
|---|---|---|---|
| 2010/0191516 A1* | 7/2010 | Benish .................... | E21B 43/00 703/10 |
| 2012/0016649 A1* | 1/2012 | Thambynayagam ... | E21B 43/12 703/10 |
| 2013/0138348 A1* | 5/2013 | Shako .................... | G01V 9/005 702/12 |
| 2016/0187533 A1* | 6/2016 | Maucec ............... | G01V 99/005 703/10 |
| 2017/0067335 A1* | 3/2017 | Weng .................. | E21B 47/1005 |

FOREIGN PATENT DOCUMENTS

| | | |
|---|---|---|
| WO | 2010068643 A1 | 6/2010 |
| WO | 2011064210 A2 | 6/2011 |
| WO | 2013192516 A2 | 12/2013 |

OTHER PUBLICATIONS

E. Al-Safran et al., "Investigation of slug flow characteristics in the valley of a hilly-terrain pipeline", Jun. 24, 2003.
Office Action for Great Britain Application No. 1410050.7, dated Dec. 9, 2014.
International Search Report and Written Opinion for PCT/EP2015/062513, dated Dec. 4, 2015.
Preliminary Report on Patentability for PCT/EP2015/062513, dated Dec. 6, 2016.

* cited by examiner

METHOD OF ESTIMATING WELL PRODUCTIVITY ALONG A SECTION OF A WELLBORE

RELATED APPLICATIONS

This application claims the benefit under 35 U.S.C. § 371 of the filing date of International Patent Application No. PCT/EP2015/062513, having an international filing date of Jun. 4, 2015, which claims priority to Great Britain Application No. 1410050.7, filed Jun. 6, 2014, the contents of both of which are incorporated herein by reference in their entirety.

The present invention relates to a method of estimating a well inflow profile along a section of a wellbore passing through a formation by collecting selected field data as a function of time during testing of a well and analysing the data.

It is known to pump logging tools down into a wellbore in order to measure several parameters, such as pressure and temperature. The known methods, however, rely on being able to convey the surveillance tools to the end of the wellbore and back, either with coiled tubing, tractor, drill pipe, wireline or similar conveyance techniques.

It has in addition been suggested to deploy self-propelled drones provided with different sensors into a wellbore.

EP 2 504 527 (Maersk Olie & Gas NS) discloses an apparatus and a method for measuring data in a well extending below surface.

Several recent papers describe the use of a Distributed Temperature Sensing (DTS) system to estimate inflow profiles. However, DTS requires the well to be equipped with a fibre optic cable and provides measurement of temperatures along the well.

Safran et. al. (E. AL-Safran, C. Sarica, H. Q. Zhang, J. Brill: "Investigation of slug flow characteristics in the valley of a hilly-terrain pipeline", International Journal of Multiphase Flow 31 (2005)) teaches how slugs initiate, collapse, change size and frequency etc. during a number of experimental set-ups where flow rate and bend inclination of a single "dog-leg" on the flowline geometry was changed. The slugs were characterised in terms of length, velocity, frequency, liquid hold-up etc. and the detailed characteristics of the flow regime showed an interplay between important parameters like fluid phase properties, individual fluid phase velocity along the well and the well geometry.

Long and ultra-long horizontal wells with horizontal sections up to approx. 9000 meters (approx. 30000 feet) are being used to develop oil and gas reservoirs. Reservoir rock properties like porosity, permeability and fluid phase saturations often vary along the reservoir sections of the horizontal wells and for many carbonate reservoirs the variation of fluid mobility may be very significant. Existing high permeability streaks or fracture network may give rise to skewed well inflow or outflow profiles. Especially during IOR (Increased Oil Recovery) or EOR (Enhanced Oil Recovery) development phases natural or induced connections between injectors and producers have an adverse effect on the recovery profile and especially on ultimate recovery fractions.

Data on the inflow profile for producing wells are considered important and valuable information for the optimisation of the reservoir development and for many marginal fields it is essential information. However, for horizontal wells the well intervention required for traditional production logging operation is very expensive, is associated with increased operational risk, and requires significant downtime of well operation. For many well sections well intervention for logging purposes is difficult with the current technology, hence the value of such data will be considered very useful for reservoir development and management purposes even with some uncertainty associated with the method.

The object of the present invention is to estimate variations in well inflow profile in the longitudinal direction of the wellbore in a cost efficient manner.

In view of this object, disclosed is a method of estimating a well inflow profile along a section of a wellbore of a well passing through a formation. The method comprises:
collecting field data as a function of time during testing of the well,
analysing the collected field data to obtain selected field parameters,
providing a created dynamic simulation model of the well inflow profile of the well based on at least the geometry of the well,
defining a number of different possible inflow profile scenarios,
simulating the defined inflow profile scenarios by means of the dynamic simulation model,
analysing the simulated inflow profile scenarios to obtain characteristics of intermittent or slug flow behaviour in the form of selected modelling parameters as a function of time,
comparing the selected modelling parameters as a function of time for each inflow profile scenario to the corresponding selected field parameters as a function of time and identifying the most likely inflow profile scenario on the basis thereof,
estimating the well inflow profile along the section of the wellbore based on the comparison of the selected modelling parameters as a function of time to the corresponding selected field parameters as a function of time.

According to an aspect, disclosed is also a system for estimating a well inflow profile along a section of a wellbore of a well passing through a formation. The system comprises a processor for:
collecting field data as a function of time during testing of the well,
analysing the collected field data to obtain selected field parameters,
providing a created dynamic simulation model of the well inflow profile of the well based on at least the geometry of the well,
defining a number of different possible inflow profile scenarios,
simulating the defined inflow profile scenarios by means of the dynamic simulation model,
analysing the simulated inflow profile scenarios to obtain characteristics of intermittent or slug flow behaviour in the form of selected modelling parameters as a function of time,
comparing the selected modelling parameters as a function of time for each inflow profile scenario to the corresponding selected field parameters as a function of time and identifying the most likely inflow profile scenario on the basis thereof,
estimating the well inflow profile along the section of the wellbore based on the comparison of the selected modelling parameters as a function of time to the corresponding selected field parameters as a function of time.

The selected field parameters may comprise volume (size) and/or velocity and/or frequency of the slugs. The frequency parameter may comprise or be dominant frequencies in the frequency domain achieved from Fourier transform, wavelet analysis, or similar signal processing methods. Other field parameters may comprise fluid properties, and superficial fluid phase velocities may impact the characteristics of the slugging behaviour.

Volume, frequency and velocity may be used for describing the slug. However, a slug may also have different levels on entrainment of the other phases, which may be captured or picked up by ultra-sensitive temperature measurements.

The selected field parameters may comprise detailed information on the fluid flow as measured at surface. This may be variations in gas, oil and water flow rate versus time. The more detailed information, the better the estimation of the well inflow profile will be. Additionally, pressure and temperature measurements may be used at least at the tubing head (top of the well) and/or also at the bottom hole gauge, which is normally located in the vertical section above the reservoir (100-500 ft).

Collecting the field data may comprise receiving or obtaining the field data from the device or gauge where the field data is collected. Collecting the field data may comprise the physical or actual collection of the field data from the device or gauge.

Providing the created dynamic simulation model may comprise receiving, retrieving or obtaining the model from the device, processor, computer or unit where the model is created. Providing the created dynamic simulation model may comprise creating the dynamic simulation model. The dynamic simulation model can be created separately from the performance of the method of estimating a well inflow profile along a section of a wellbore of a well passing through a formation, e.g. the dynamic simulation model may be created before the method of estimating the well inflow profile is performed, and the model may then be retrieved and used in the method.

The well model may comprise information on the trajectory of the well, the casing scheme and completion details, e.g. all the mechanical details of the downhole part of the well.

Obtaining characteristics of intermittent or slug flow behaviour may comprise receiving or retrieving the characteristics of intermittent or slug flow behaviour from the device, processor, computer or unit where the characteristics of intermittent or slug flow behaviour is calculated or computed or withdrawn from the model. Obtaining characteristics of intermittent or slug flow behaviour may comprise calculating or computing or withdrawing the characteristics of intermittent or slug flow behaviour.

According to an aspect, disclosed is a computer program comprising program code means for performing the steps of the method above and/or of any embodiments disclosed in the following.

In this way, a well inflow profile may be estimated without the type of well intervention required for traditional production logging operation, as the estimation may be based on well data already available during normal production, such as surface measurements of different parameters and pressure and temperature measurements from one or several downhole gauges. The downhole gauges are typically but not necessarily placed above the reservoir section.

By analysing simulated inflow profile scenarios to describe characteristics of intermittent or slug flow behaviour in the form of selected modelling parameters and comparing the results of said analysis to the corresponding collected field data a suitable estimate of a well inflow profile may be obtained as a result of the different behaviour of one or more slugging mechanisms, such as hydrodynamic or terrain induced intermittent or slug flow, for different inflow profiles of the well.

The method according to the present invention may therefore provide a very low cost and efficient way of surveying a larger number of wells. From a reservoir management point of view, information on the inflow profile (especially additional water and gas rates) may provide good indications of high permeability, low permeability, and fractured areas of the reservoir. Even if a certain level of uncertainty would be present as a result of the method being an estimate, the method according to the invention may be very useful for the selection of candidate wells for more expensive well intervention based logging methods.

It is an advantage of the method and system that it allows for using the information in the well signal from field parameters, such as pressure, temperature and flow rates coming out of the well to estimate the well inflow profile. Thus it is an advantage that measurements along the well are not needed and do not need to be relied on. Prior art shows methods where pressure, and maybe temperature, sensors along the well have been used to estimate the well inflow profile. Hence information on the pressure and temperature changes in several sections along the well is used in prior art to estimate the inflow profile. Thus prior art relies on pressure and temperature changes between two points.

It is an advantage of the present method and system that field parameters such as pressure, temperature and flow rate changes may be measured at the same point, i.e. the same physical location, and how these field parameters such as pressure, temperature and flow rate changes with time at the same point. This information about field parameters may be obtained or retrieved from or out of the well signal, such as from a downhole gauge in the well.

The signal or data may be obtained downstream of the producing interval or reservoir section. Thus it is an advantage that estimation of an inflow profile from data only recorded downstream on the producing interval can be achieved by the method.

It is a further advantage that an inflow profile based entirely on measurements made outside of the producing interval can be achieved by the method.

Data may be collected both at the tubing head and at bottom hole or downhole gauge, which is still above the producing interval. The more data that can be collected, the higher is the likelihood that a good estimate of the inflow profile can be provided. Thus it is an advantage that the inflow profile may be estimated based entirely on measurements made outside of the producing interval.

The downhole gauge may be arranged downstream of the reservoir section or downstream of the production interval. Downstream of the reservoir section corresponds to vertically above the reservoir section, such as between the reservoir section and the tubing head. The downhole gauge may be arranged as close to the reservoir section as possible, such as 100 meters or 200 meters above the reservoir section. The field data collected at the downhole gauge may be temperature and pressure.

When the field data, such as temperature and pressure, is measured at the downhole gauge, such as only measuring at one fixed point, and when the field data, such as the temperature measurement, is very precise, such as with an accuracy of $1/100$ of a degrees, Fahrenheit or Celcius, it is possible to detect small changes in temperature over time at the same measurement point. These small temperature changes can be used as input for estimating the well inflow profile.

Thus the proposed method can be used to enhance reservoir management by frequent analysis of wells, in the form of estimating the well inflow profile by showing increasing or decreasing rates of oil, water or gas along the well. This information may solve a technical problem of selecting which oil wells to operate, or how to operate different oil wells.

The proposed method may use measurements already available or available at a very low cost at the tubing head (surface) and therefore provides a very attractive alternative to the traditional well intervention. During prior art well interventions tools to measure rates are deployed in the well i.e. by tractor or coiled tubing, which is a high cost operation with a certain risk of compromising the well due to stuck/lost tools in the hole.

It is an advantage of the method and system that it allows for using only signals or data obtained downstream of the production interval to estimate the inflow profile. This is a no-intervention method which relies on data already available or available at a very low cost to estimate the inflow profile. Thus this is in contrast to the prior art where intervention tools are run into the well at high cost and at high operational risk.

Recent prior art methods describe distributed temperature sensing (DTS) and distributed acoustic sensing (DAS) to estimate inflow profiles. This technology comprises one or more fibre optic cables collecting a lot of information along the entire wellbore. However, these measurements require well intervention or pre-installed cables and are therefore expensive.

It is an advantage of the present method and system that measurements at a very few locations, for example downstream of the reservoir section or producing interval, are used and that these measurements are available at a very low cost. High resolution signals for the modelling may be used to estimate the well inflow profile.

The dynamic simulation model may be updated or adjusted, such as updated or adjusted continually or regularly, based on the output of the model. For example if the model simulates a productivity of a certain amount of oil in a well, and the actual measured amount produced, such as an average amount, is different, such as higher or lower, than the simulated productivity, the model can be updated or adjusted based on the actual amount produced. Thus the model can be updated or adjusted when the actual amount produced is measured to be higher or lower, such as within a predefined threshold, than the simulated amount produced. The model can be updated or adjusted at predefined time intervals, such as one or more times each day, such as one or more each week, one or more times each month etc. The update or adjustment of the model may depend on the capacity of the processor, such as a central processing unit, and/or depending on the complexity of the model.

In an embodiment the method comprises:
creating the dynamic simulation model taking into account modelling input at least in the form of the geometry of the well, such as diameters and/or deviation survey for the wellbore,
possibly repeating the steps of:
defining the number of different possible inflow profile scenarios,
simulating the defined inflow profile scenarios by means of the dynamic simulation model,
analysing the simulated inflow profile scenarios to obtain the characteristics of intermittent or slug flow behaviour in the form of the selected modelling parameters as a function of time,
comparing the selected modelling parameters as a function of time for each inflow profile scenario to the corresponding selected field parameters as a function of time and identifying the most likely inflow profile scenario on the basis thereof,
by iteratively adjusting the defined inflow profile scenarios, and
using the best obtained match between the result of said analysis and the collected field data as the estimated well inflow profile along the section of the wellbore.

In an embodiment the following steps may be performed:
a) creating a dynamic simulation model taking into account modelling input at least in the form of the geometry of the well, such as diameters and/or deviation survey for the wellbore,
b) defining a number of different possible inflow profile scenarios,
c) simulating the defined inflow profile scenarios by means of the dynamic simulation model,
d) analysing the simulated inflow profile scenarios to describe characteristics of intermittent or slug flow behaviour in the form of selected modelling parameters as a function of time,
e) comparing the result of said analysis in the form of the selected modelling parameters as a function of time for each inflow profile scenario to the corresponding collected field data as a function of time and identifying the most likely inflow profile scenario on the basis thereof,
f) possibly repeating the above steps b) to e) by iteratively adjusting the defined inflow profile scenarios,
g) using the best obtained match between the result of said analysis and the collected field data as the estimated well inflow profile along the section of the wellbore.

In a preferred embodiment, the selected modelling parameters include at least one of the parameters pressure, temperature and flow behaviour.

In an embodiment, the selected modelling parameters include any combination of:
Bottom hole pressure,
Bottom hole temperature,
Tubing head pressure,
Tubing head temperature,
Flow line pressure,
Flow line temperature,
Separator temperature,
Separator gas rate,
Separator oil rate,
Separator water rate,
Lift gas injection rate.

The result of the estimation of the inflow profile may be improved by selecting a number of modelling parameters, such as those listed above.

In an embodiment, the characteristics of intermittent or slug flow behaviour are described by at least one of the parameters volume, velocity and frequency of the slugs. The result of the estimation of the inflow profile may be improved by describing the characteristics of the intermittent or slug flow behaviour by more parameters.

In an embodiment, the dynamic simulation model is created taking into account furthermore at least one of the following modelling inputs:

Fluid phase property models (such as for oil, gas, lift gas, and water),

Flow line geometry,

Separator setting and operational input,

Separator pressure,

Possibly further reservoir properties.

The result of the estimation of the inflow profile may be improved by taking into account more modelling inputs.

In an embodiment, the collection of selected field data as a function of time during testing of the well is performed at least during steady state tests, whereby variables such as choke, separator settings, gas lift etc. are maintained at least substantially constant.

In an embodiment, the collection of selected field data as a function of time during testing of the well is performed at least during step rate tests, whereby the flow rate is respectively increased and/or decreased.

High permeability, low permeability and fractured reservoir sections may respond differently to so-called well bean-up or bean-back, whereby the flow rate is increased or decreased, respectively. The transient associated with flush or negative-flush production may be different for these reservoir sections and analysis of the well signal during step rate tests of the well may provide additional information which may improve the accuracy of the well inflow profiling estimate.

In an embodiment, the collection of selected field data is performed downstream of the producing interval. For example the collection of selected field data is performed at a downhole gauge, i.e. at a fixed point, downstream of the producing interval. The field data may be collected from the well signal and collected by a downhole gauge in the well. The downhole gauge may be arranged downstream of the reservoir section or downstream of the production interval. Downstream of the producing interval or reservoir section corresponds to vertically above the producing interval or reservoir section, such as between the producing interval or reservoir section and the tubing head. The fixed point corresponds to the position of the downhole gauge. The downhole gauge may be arranged as close to the reservoir section as possible, such as 100 meters or 200 feet above the reservoir section. The field data collected at the downhole gauge may be temperature and pressure.

When the field data, such as temperature and pressure, is measured at one point at the downhole gauge, and when the field data, such as the temperature measurement, is very precise, such as with an accuracy of $1/100$ of a degrees, Fahrenheit or Celcius, it is possible to detect small changes in temperature over time at the same measurement point. These small temperature changes can be used as input for estimating the well inflow profile.

Thus it is an advantage that estimation of an inflow profile from data only recorded downstream on the producing interval can be achieved. It is a further advantage that an inflow profile based entirely on measurements made outside of the producing interval can be achieved.

In an embodiment the collection of selected field data is performed at the tubing head. Field data collected at the tubing head or surface of the well may typically be pressure and temperature.

Thus it is an advantage that estimation of an inflow profile from data only recorded downstream of the producing interval, such as at the tubing head or surface can be achieved. It is a further advantage that an inflow profile based entirely on measurements made outside of the producing interval can be achieved.

Thus data may be collected both at the tubing head and at bottom hole or downhole gauge, which is still above the producing interval. The more data that can be collected, the higher is the likelihood that a good estimate of the inflow profile can be provided. Thus the inflow profile is estimated based entirely on measurements made outside of the producing interval.

In an embodiment, the collected field data are analysed to recognise dominant frequencies in the frequency domain achieved from Fourier transform, wavelet analysis, or similar signal processing methods. The recognition of dominant frequencies may improve the comparison of simulated modelling parameters and the corresponding collected field data and may therefore result in an improved accuracy of the well inflow profiling estimate.

In an embodiment, the shape of the temperature signals is analysed, preferably in the deviation range of less than approximately 0.028 degrees Celsius (0.05 degrees Fahrenheit), more preferred less than approximately 0.0056 degrees Celsius (0.01 degrees Fahrenheit), even more preferred less than approximately 0.0028 degrees Celsius (0.005 degrees Fahrenheit) and most preferred less than approximately 0.00056 degrees Celsius (0.001 degrees Fahrenheit). The analysis and comparison of the shape of the temperature signals may be performed by "eyeballing" graphs or by means of sophisticated signal processing software. Thereby, an improved accuracy of the well inflow profiling estimate may be obtained.

In an embodiment, the shape of the pressure signals is analysed, preferably in the deviation range of less than approximately 70,000 Pa (approximately 10 psi), more preferred less than approximately 35,000 Pa (approximately 5 psi), even more preferred less than approximately 7,000 Pa (approximately 1 psi), even more preferred less than approximately 700 Pa (approximately 0.1 psi) and most preferred less than approximately 70 Pa (approximately 0.01 psi). Thereby, an improved accuracy of the well inflow profile estimate may be obtained.

According to an aspect disclosed is a method of estimating a well inflow profile along a section of a wellbore of a well passing through a formation. The method comprises:

collecting field data as a function of time during testing of the well, analysing the collected field data to obtain selected field parameters, providing a created dynamic simulation model of the well inflow profile of the well based on at least the geometry of the well, from the created dynamic simulation model obtaining characteristics in the form of selected modelling parameters as a function of time of intermittent or slug flow behaviour, comparing the selected modelling parameters as a function of time to the corresponding selected field parameters as a function of time, estimating the well inflow profile along the section of the wellbore based on the comparison of the selected modelling parameters as a function of time to the corresponding selected field parameters as a function of time.

According to an aspect, disclosed is a system for estimating a well inflow profile along a section of a wellbore of a well passing through a formation. The system comprises a processor for:

collecting field data as a function of time during testing of the well, analysing the collected field data to obtain selected field parameters, providing a created dynamic simulation model of the well inflow profile of the well based on at least the geometry of the well, from the created dynamic simulation model obtaining characteristics in the form of selected modelling parameters as a function of time of intermittent or slug flow behaviour, comparing the selected modelling parameters as a function of time to the corresponding selected field parameters as a function of time, estimating the well inflow profile along the section of the wellbore based on the comparison of the selected modelling parameters as a function of time to the corresponding selected field parameters as a function of time.

The invention will now be explained in more detail below by means of examples of embodiments with reference to the very schematic drawing, in which.

Many horizontal wells experience some kind of intermittent or slug flow regime in the horizontal section of the well. Once initiated, the slug flow regime will have an impact on the behaviour on the remaining part of the well at normal operating conditions.

Multiphase flow is normally described and characterised by one of several flow regimes like slug, mist, annular, bubble flow etc. The slug flow regime is by far the most abundant flow regime in oil producing wells.

The slug flow is characterised by periodically alternating long gas bubbles and liquid plugs and exists in a wide range of flow regime parameters. The slugs may be characterised by volume, velocity and frequency of the slugs. The flow regime also depends strongly on the geometry of the well: the inner diameter, possible annuli open to flow and the well trajectory. Slugging due to varying inclination of the wellbore is named terrain induced slugging and, according to the present invention, observed differences in the overall hydrodynamic behaviour of the well due to terrain induced slugging along the (near) horizontal reservoir section is being used to identify the inflow profile of the well. Additionally, parameters like fluid properties, and superficial fluid phase velocities impact the characteristics of the slugging behaviour.

During drilling of wells geo-steering is often used to adjust the well trajectory for optimum placement in the reservoir section with respect to reservoir properties and fluid saturations. This adaptive correction of the planned well trajectory gives rise to the so-called "dog-legs", where the well bends up and down by typically 1-5 degrees over for instance 100 to 1000 meters along-hole intervals (for instance hundreds or a few thousand feet).

Figure 1A:
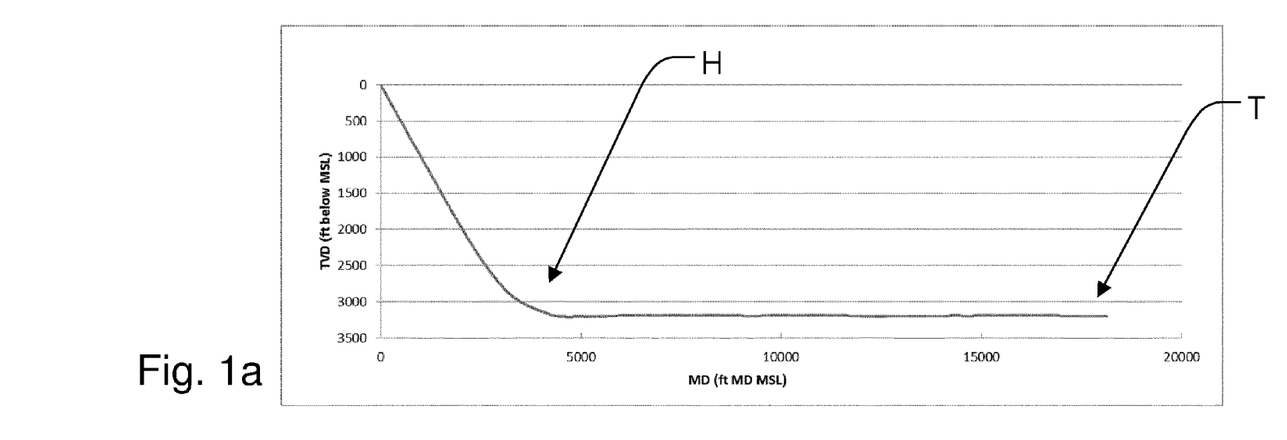
FIG. 1a illustrates a typical well trajectory.
Figure 1B:
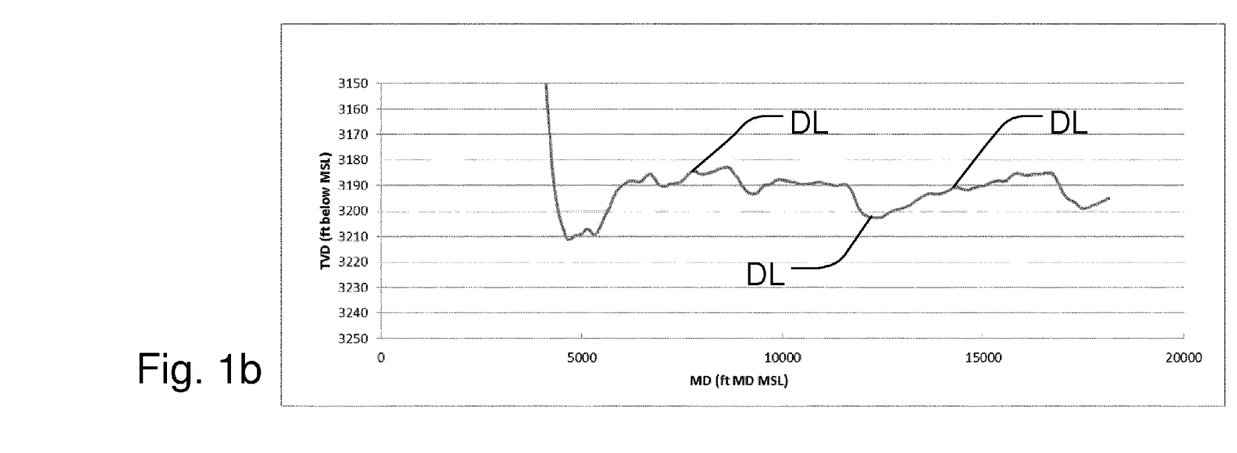
FIG. 1b illustrates part of the well trajectory of FIG. 1a, "zoomed in" to reservoir level.

A typical well example is illustrated in FIG. 1a, wherein a wellbore has a heel (H) and a toe (T). The several dog-legs (DL) become very visible when zooming in to reservoir level as illustrated in FIG. 1b. These dog-legs give rise to very distinct flow patterns named terrain induced slugging as described in Safran et. al. and mentioned in the introduction. The fully integrated modelling of this relationship may reveal valuable information about the well flow profile.

FIG. 1a illustrates a typical well trajectory by showing the True Vertical Depth (TVD) as a function of the Measured Depth (MD) from the Mean Sea Level (MSL). The units of both axes are feet (feet to meter conversion: 1 ft=0.305 m). FIG. 1b illustrates part of the well trajectory of FIG. 1a, "zoomed in" to reservoir level, in that the scale of the ordinate has been changed. It may thereby be seen that the dog-legs vary in an interval of approximately 10 meters (approximately 30 ft) along the ordinate, whereby TVD of the well trajectory is approximately 975 meters (approximately 3200 ft TVD).

Traditionally, slug flow modelling has been characterised from the observed frequencies of tubing head pressure (THP) and bottom hole pressure (BHP) fluctuations. However, according to the present invention, it has been found that flow rate and temperature data as well may contain significant more information, which allows an even better characterisation of the inflow profile.

FIGS. 2a to 2d illustrate typical variation in some selected field data collected during an example test of a first specific slugging well. Especially the temperature profile reveals a characteristic of the shape and content of the slug. However, as it may be seen, also several other parameters reveal such information.

Figure 2A:
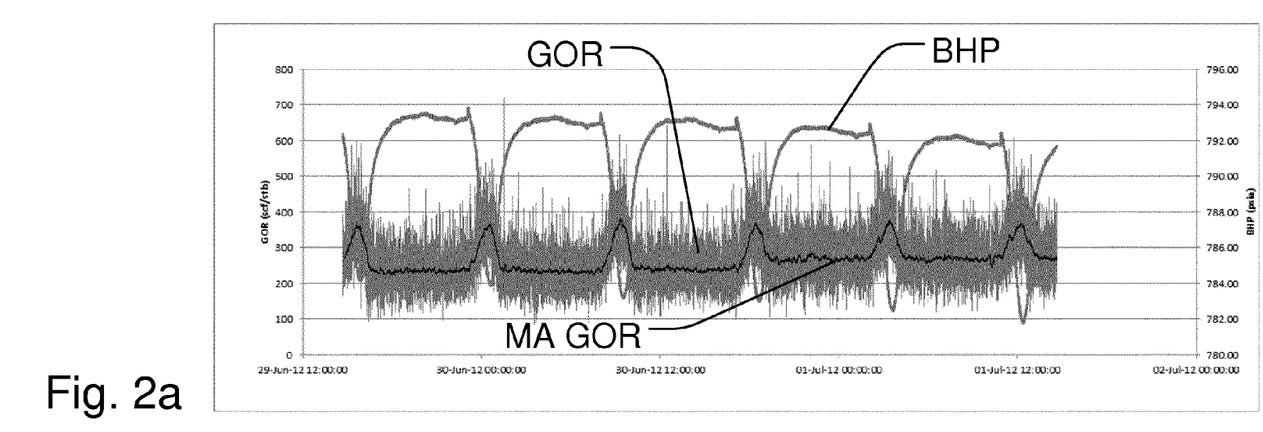
FIGS. 2a to 2d illustrate typical variation in some selected field data collected during an example test of a specific wellbore.

In FIG. 2a, the abscisse indicates the point in time marked by intervals of 12 hours, and the right ordinate, the Bottom Hole Pressure (BHP) in psia (1 psia corresponding to 6894.75728 Pa), and the left ordinate, the Gas to Oil Ratio (GOR) in scf/stb (standard cubic feet per stock tank barrel corresponding to 0.178137 $m^3/m^3$). The selected field data illustrated by the graphs include Bottom Hole Pressure (BHP), Gas to Oil Ratio (GOR), and Moving Average of the Gas to Oil Ratio (MA GOR). It is seen that especially the BHP profile reveals a characteristic of the shape and content of the slug.

When the shape of the pressure signals is analysed, preferably this may be done in the deviation range of up to approximately 140,000 Pa (approximately 20 psi). Even more preferred, it may be done in the deviation range of up to approximately 70,000 Pa (approximately 10 psi). Even more preferred, it may be done in the deviation range of less than approximately 35,000 Pa (approximately 5 psi), even more preferred less than approximately 7,000 Pa (approximately 1 psi), even more preferred less than approximately 700 Pa (approximately 0.1 psi) and most preferred less than approximately 70 Pa (approximately 0.01 psi). As seen in FIG. 2a, the BHP varies between approximately 782 and 794 psia corresponding to a deviation range of approximately 12 psi.

Figure 2B:
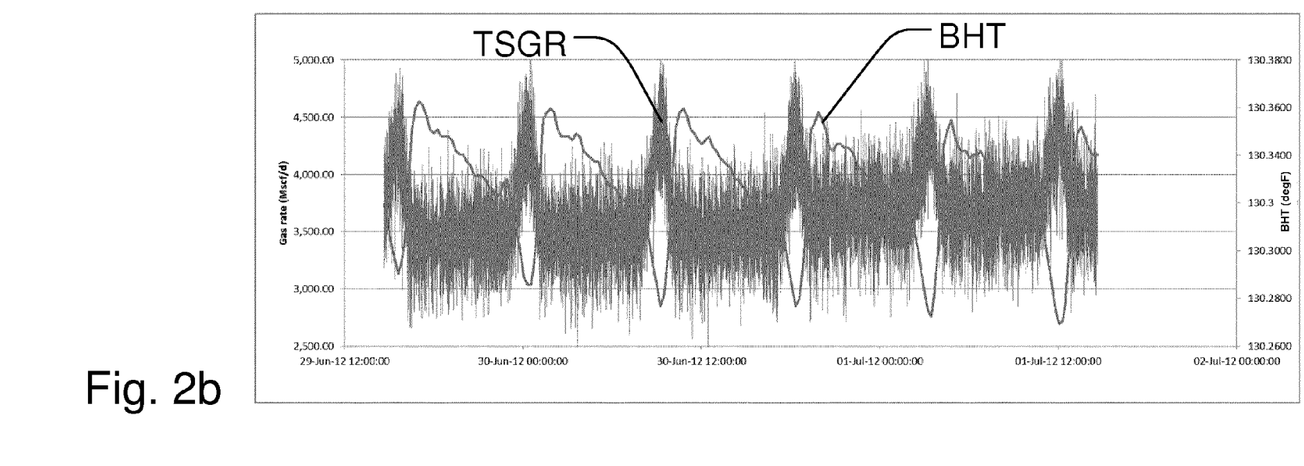

In FIG. 2b, the abscisse indicates the point in time marked by intervals of 12 hours, and the right ordinate, the Bottom Hole Temperature (BHT) in degF (degC corresponding to (degF−32)/1.8000), and the left ordinate, the Gas Rate (GR) in Mscf/d (one thousand standard cubic feet per day corresponding to 28.31685 cubic meters per day m$^3$/day). The selected field data illustrated by the graphs include Bottom Hole Temperature (BHT) and Test Separator Gas Rate (TSGR). It is seen that especially the BHT profile reveals a characteristic of the shape and content of the slug.

When the shape of the temperature signals is analysed, preferably this may be done in the deviation range of between approximately 0.0112 degrees Celsius (0.02 degrees Fahrenheit) and approximately 0.056 degrees Celsius (0.1 degrees Fahrenheit). Even more preferred, it may be done in the deviation range of between approximately 0.0056 degrees Celsius (0.01 degrees Fahrenheit) and approximately 0.028 degrees Celsius (0.05 degrees Fahrenheit). As seen in the example in FIG. 2b, the BHT varies between approximately 130.27 and 130.37 degrees Fahrenheit corresponding to a deviation range of approximately 0.1 degrees Fahrenheit.

Figure 2C:
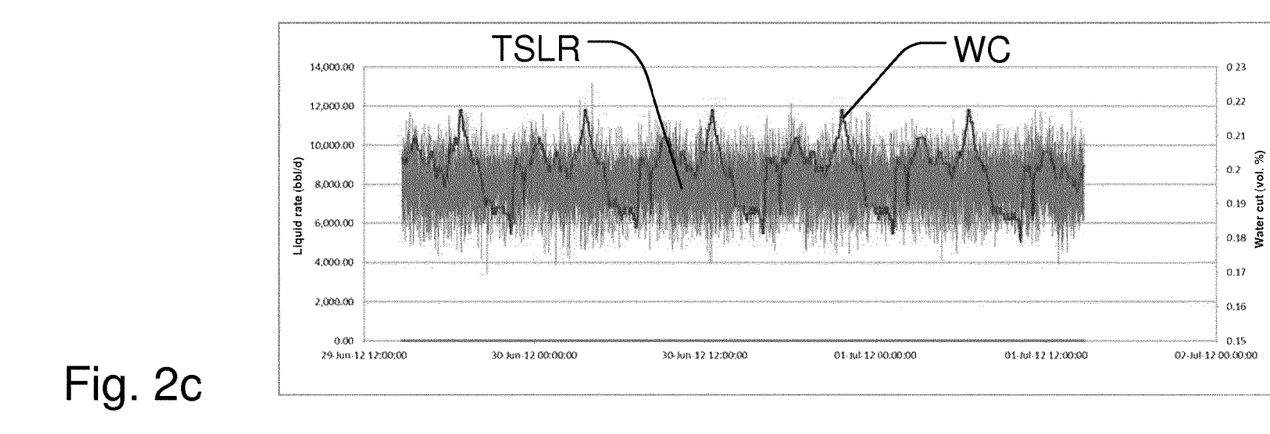

In FIG. 2c, the abscissa indicates the point in time marked by intervals of 12 hours, and the right ordinate, the Water Cut (WC) in volume percent (%), which is the ratio of volume of water produced compared to the volume of total liquids produced, and the left ordinate, the Liquid rate in bbl/d (one barrel per day, bbl/d, corresponding 0.159 cubic meters per day, m$^3$/day). The selected field data illustrated by the graphs include Water Cut (WC) and Test Separator Liquid Rate (TSLR). It is seen that especially the WC profile reveals a characteristic of the shape and content of the slug.

Figure 2D:
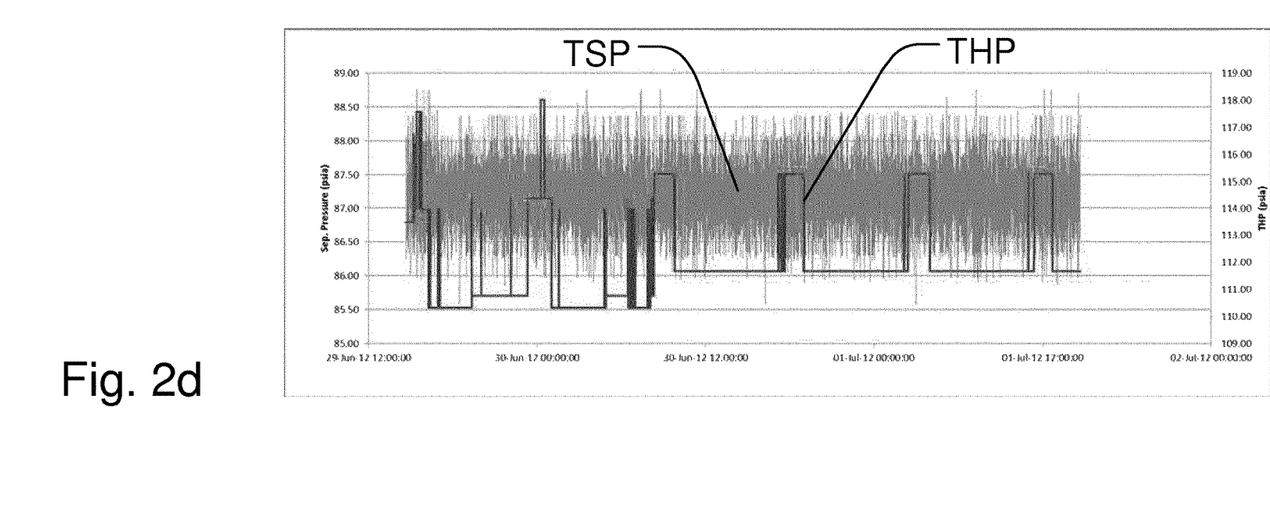

In FIG. 2d, the abscissa indicates the point in time marked by intervals of 12 hours, and the right ordinate, the Tubing Head Pressure (THP) in psia (1 psia corresponding to 6894.75728 Pa), and the left ordinate, the Separator Pressure in psia. The selected field data illustrated by the graphs include Tubing Head Pressure (THP) and Test Separator Pressure (TSP). It is seen that especially the THP profile reveals a characteristic of the shape and content of the slug. However, it is seen that the THP signal is influenced by the dead-band setting on the gauge recording, hence only a change of a certain size has been registered. Therefore, advantageously, higher resolution recordings may be applied.

Figure 3A:
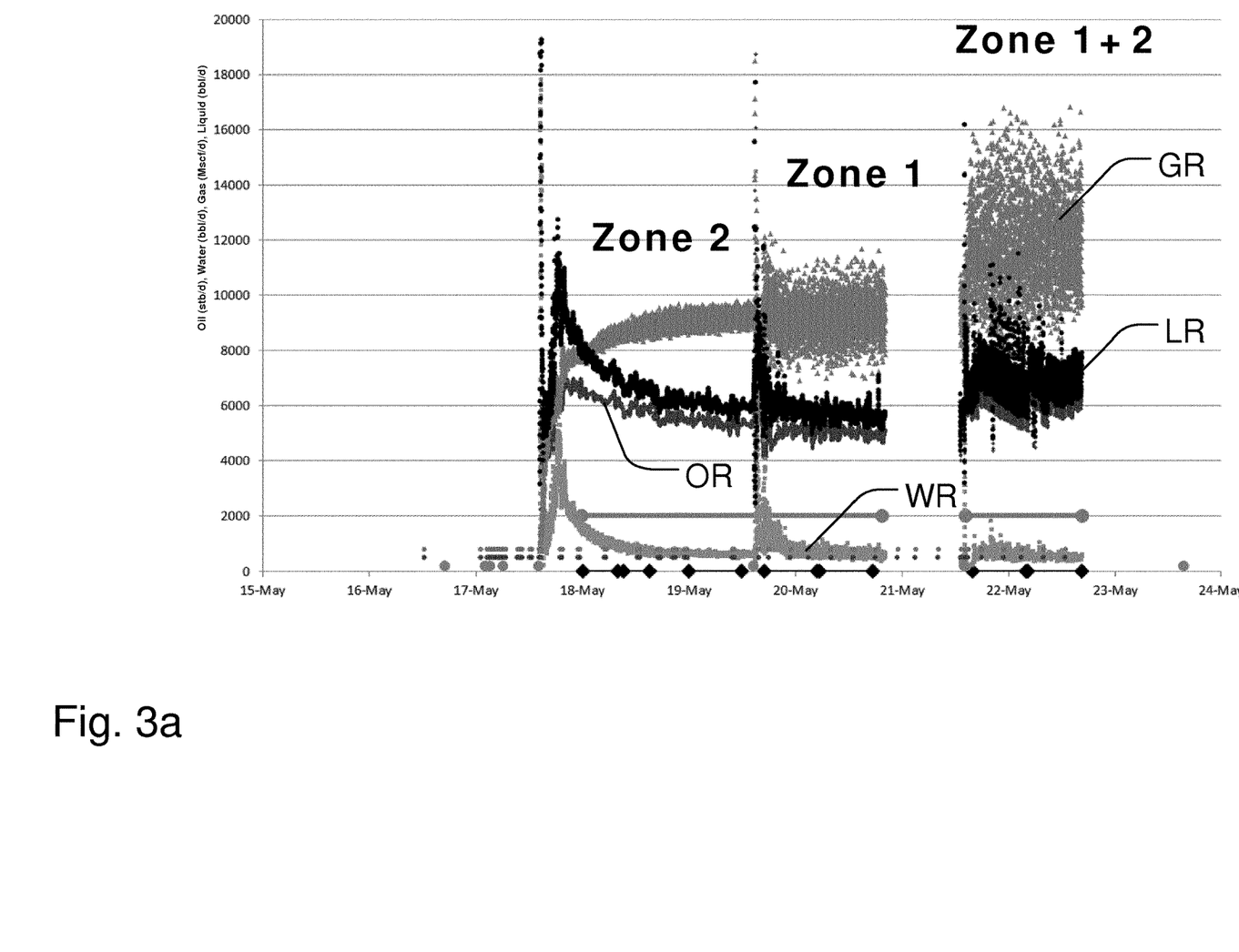
FIGS. 3a and 3b illustrate variation in some selected field data collected during an example test of a specific wellbore having two zones isolated by means of a packer.
Figure 3B:
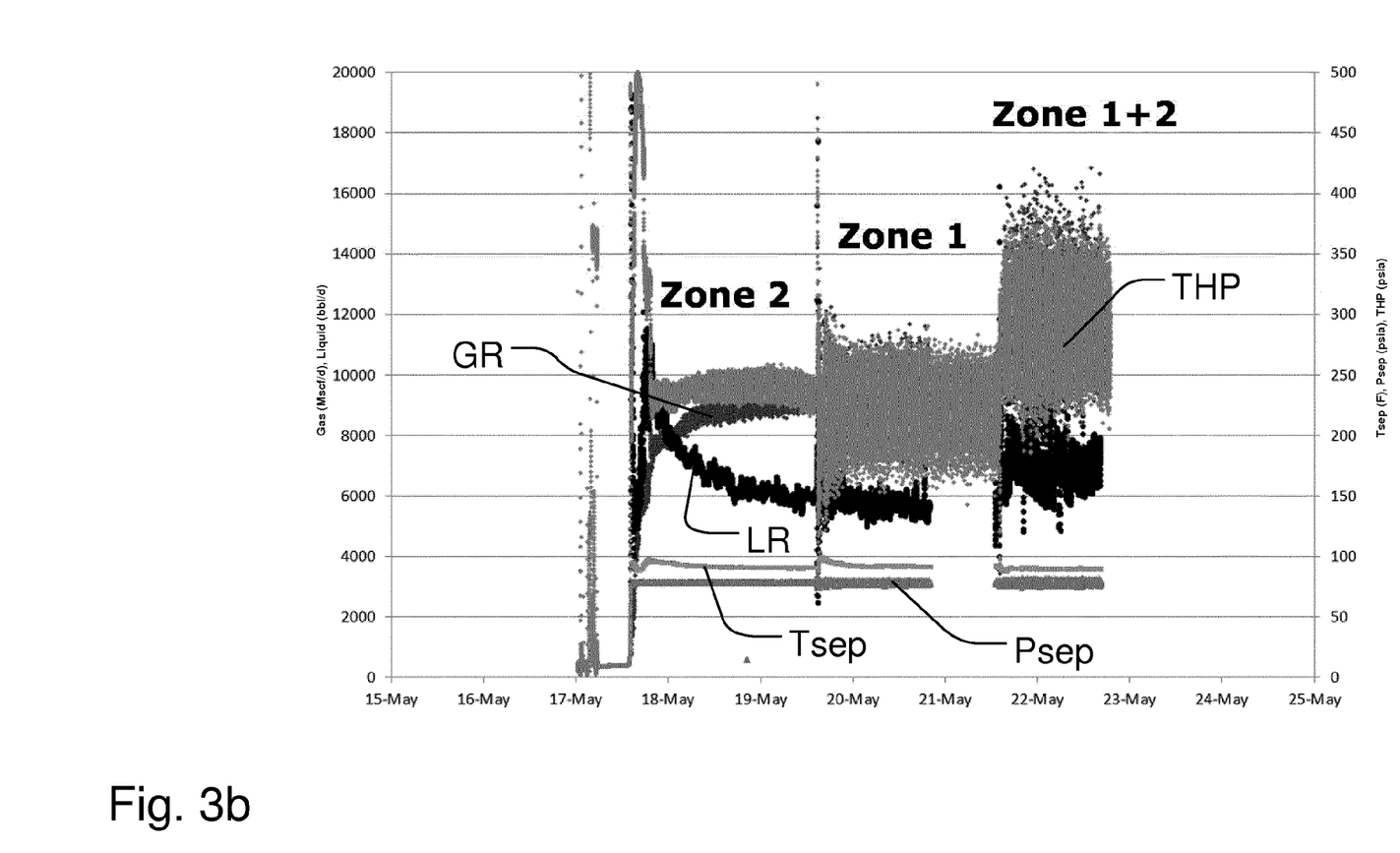

FIGS. 3a and 3b illustrate typical variation in some selected field data collected during an example test of a second specific slugging well. This specific well is separated into two zones (zone 1, zone 2) by means of a packer that is leaking. The well has been tested in three different configurations, namely a first configuration, whereby production has been enabled only from zone 2, a second configuration, whereby production has been enabled only from zone 1, and a third configuration, whereby production has been enabled both from zone 1 and zone 2, as indicated on the figures. It is seen that due to the leaking packer, especially parameters such as Gas Rate (GR) and Tubing Head Pressure (THP), although having a mean value that varies relatively little between the three different test configurations, nevertheless, the fluctuations of these parameters indicate different slug size distribution between the three different test configurations.

In FIG. 3a, the abscissa indicates the point in time marked by intervals of one day, and the left ordinate indicates the Oil Rate (OR) in stb/d (one stock tank barrel per day corresponding to 0.158987 cubic meters at stock tank conditions per day, m$^3$/day), the Water Rate (WR) in bbl/d (one barrel per day corresponding to 0.158987 cubic meters per day, m$^3$/day), the Gas Rate (GR) in Mscf/d (one thousand standard cubic feet per day corresponding to 28.31685 cubic meters per day m$^3$/day) and the Liquid Rate (LR) in bbl/d.

In FIG. 3b, the abscissa indicates the point in time marked by intervals of one day, and the left ordinate indicates the Gas Rate (GR) in Mscf/d and the Liquid Rate (LR) in bbl/d. The right ordinate indicates the Separator Temperature (Tsep) in degrees Fahrenheit (degrees Celcius=(degrees Fahrenheit−32)/1.8), the Separator Pressure (Psep) in psia and the Tubing Head Pressure (THP) in psia (1 psia corresponding to 6894.75728 Pa).

A commercially available software package "OLGA Dynamic Multiphase Flow Simulator" has been used for the modelling of the transient fluid flow behaviour of the well. By means of scenario based matching of simulation data to field data enough information will be revealed to allow an estimation of the inflow profile of most horizontal wells.

According to the invention a method of estimating a well inflow profile along a section of a wellbore of a well passing through a formation is described. The method comprises:
- collecting field data as a function of time during testing of the well,
- analysing the collected field data to obtain selected field parameters,
- providing a created dynamic simulation model of the well inflow profile of the well based on at least the geometry of the well,
- defining a number of different possible inflow profile scenarios,
- simulating the defined inflow profile scenarios by means of the dynamic simulation model,
- analysing the simulated inflow profile scenarios to obtain characteristics of intermittent or slug flow behaviour in the form of selected modelling parameters as a function of time,
- comparing the selected modelling parameters as a function of time for each inflow profile scenario to the corresponding selected field parameters as a function of time and identifying the most likely inflow profile scenario on the basis thereof,
- estimating the well inflow profile along the section of the wellbore based on the comparison of the selected modelling parameters as a function of time to the corresponding selected field parameters as a function of time.

According to an embodiment the method of estimating a well inflow profile along a section of a wellbore passing through a formation is performed by collecting selected field data as a function of time during testing of a well and analysing the data. The following steps may be performed:
a) creating a dynamic simulation model taking into account modelling input at least in the form of the geometry of the well, such as diameters and/or deviation survey for the wellbore,
b) defining a number of different possible inflow profile scenarios,
c) simulating the defined inflow profile scenarios by means of the dynamic simulation model,
d) analysing the simulated inflow profile scenarios to describe characteristics of intermittent or slug flow behaviour in the form of selected modelling parameters as a function of time,
e) comparing the result of said analysis in the form of the selected modelling parameters as a function of time for each inflow profile scenario to the corresponding collected field data as a function of time and identifying the most likely inflow profile scenario on the basis thereof, f) possibly repeating the above steps b) to e) by iteratively adjusting the defined inflow profile scenarios, g) using the best obtained match between the result of said analysis and the collected field data as the estimated well inflow profile along the section of the wellbore.

Step b) of defining a number of different possible inflow profile scenarios may for instance be performed in the form of defining different reservoir descriptions. Assigning (defining) a high permeability to an area in the reservoir model will inherently simulate a high inflow rate at the corresponding interval along the well, hence changing the well inflow profile.

The selected modelling parameters, e.g. of step d) above, may include any combination of:

Bottom hole pressure,
Bottom hole temperature,
Tubing head pressure,
Tubing head temperature,
Flow line pressure,
Flow line temperature,
Separator temperature,
Separator gas rate,
Separator oil rate,
Separator water rate,
Lift gas injection rate.

Preferably, the selected modelling parameters, e.g. of step d) above, include at least one of the parameters pressure, temperature and flow behaviour. Flow behavior may for instance include fluid phase velocity, frequency, and volume.

Bottom hole pressure is normally measured by means of gauges located just above the reservoir section. There may be more than one set of gauges at different positions and these may also be located deeper in the well. The same is true for the other parameters measured. When analysing the simulated inflow profile scenarios to describe characteristics of intermittent or slug flow behaviour in the form of selected modelling parameters as a function of time, these modelling parameters are described at a position or at positions in the well corresponding to the position or positions where the corresponding parameter is measured in the actual well as field data.

The characteristics of intermittent or slug flow behaviour, e.g. according to step d) above, are described during the analysis, either manually or by means of software, by at least one of the parameters size, velocity and frequency of the slugs.

The dynamic simulation model, e.g. according to step a) above, is created taking into account furthermore at least one of the following modelling inputs:

Fluid phase property models (such as for oil, gas, lift gas, and water),
Flow line geometry,
Separator setting and operational input,
Separator pressure.

The collection of selected field data as a function of time during testing of the well may be performed at least during steady state tests, and preferably at least during step rate tests, whereby the flow rate is respectively increased and/or decreased. High permeability and low permeability reservoir sections respond differently to well bean-up or bean-back. The transient associated with flush or negative-flush production will or may be different for these reservoir sections and analysis of the well signal during step rate tests of the well may provide additional information which may improve the accuracy of the proposed well inflow profiling concept. The collected field data may be analysed to recognise dominant frequencies in the frequency domain achieved from Fourier transform, wavelet analysis, or similar signal processing methods. For instance, advanced pattern recognition algorithms may be considered for this analysis.

Figure 4A:
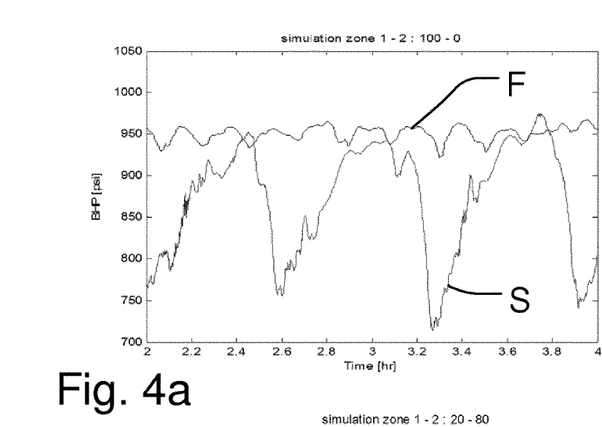
FIGS. 4a to 4d illustrate an example of the comparison of simulated (S) Bottom Hole Pressure (BHP) and the corresponding collected field (F) data for four different simulated well inflow scenarios, respectively.
Figure 4B:
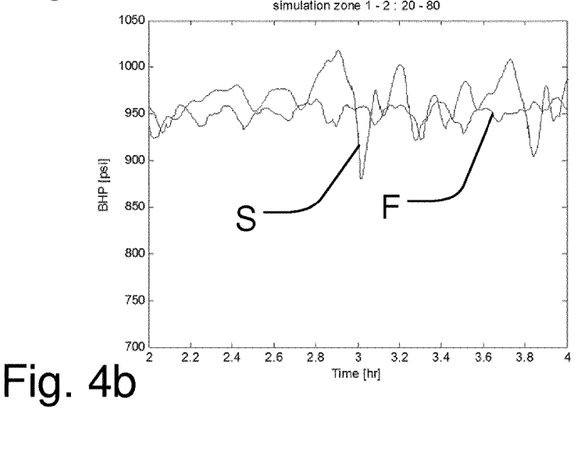
Figure 4C:
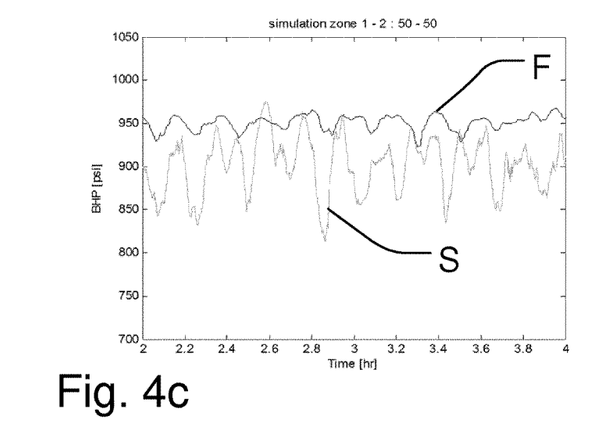
Figure 4D:
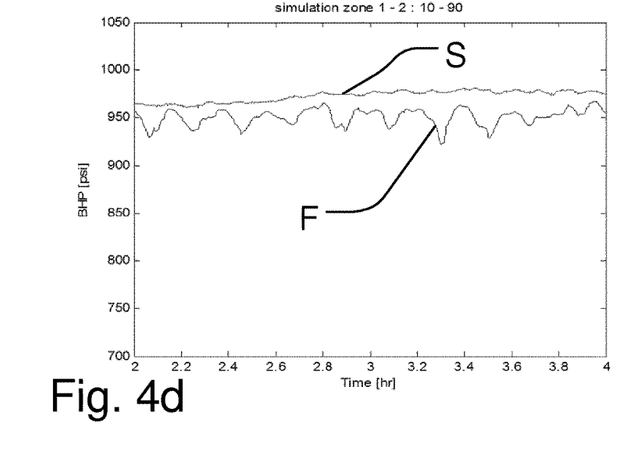
Figure 5:
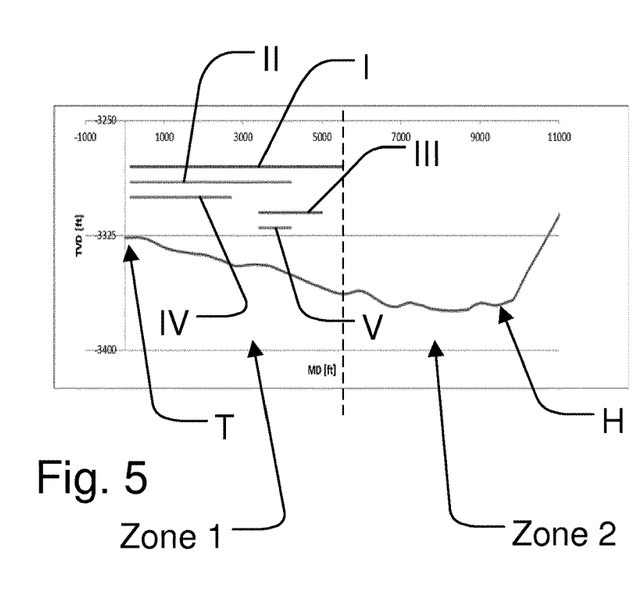
FIG. 5 illustrates an example of five different defined well inflow scenarios (I to V)
Figure 6:
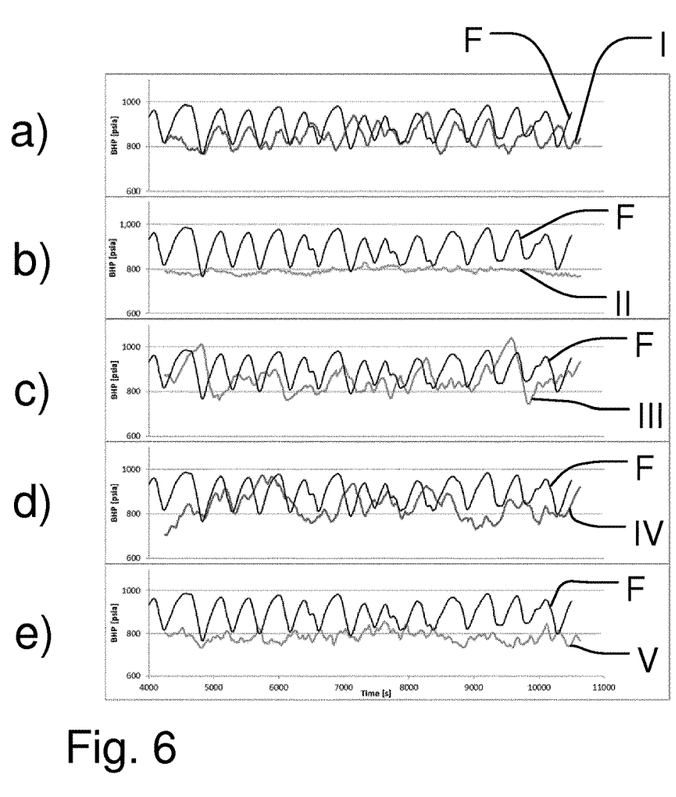
FIG. 6 illustrates an example of the comparison of simulated (S) Bottom Hole Pressure (BHP) for the five different defined inflow scenarios of FIG. 5, respectively, and the corresponding collected field (F) data.

The step, e.g step e), of the above described method according to the invention of comparing the result of said analysis in the form of the selected modelling parameters as a function of time for each inflow profile scenario to the corresponding collected field data as a function of time and identifying the most likely inflow profile scenario on the basis thereof is illustrated in FIGS. 4 to 6.

Thereby, fluctuations created by the intermittent or slugging flow in the well are analysed and used to estimate the inflow profile.

FIGS. 4a to 4d illustrate four different scenarios of simulated BHP in a wellbore having two zones, zone 1 and zone 2. The inflow distribution between these two zones is indicated in percent. For instance, simulation zone 1-2: 100-0 indicates that the inflow is 100 percent in zone 1 and 0 percent in zone 2. The simulated BHP is indicated by S and the acquired field data for the BHP is indicated by F.

FIG. 4a illustrates simulation zone 1-2: 100-0 corresponding to inflow 100 percent into zone 1 and 0 percent into zone 2.

FIG. 4b illustrates simulation zone 1-2: 20-80 corresponding to inflow 20 percent into zone 1 and 80 percent into zone 2.

FIG. 4c illustrates simulation zone 1-2: 50-50 corresponding to inflow 50 percent into zone 1 and 50 percent into zone 2.

FIG. 4d illustrates simulation zone 1-2: 10-90 corresponding to inflow 10 percent into zone 1 and 90 percent into zone 2.

As it may be seen, the match of FIG. 4d seems to be the best, although the match is not perfect. In this case, possibly step f) of the above described method according to the invention of repeating the above steps b) to e) by iteratively adjusting the defined inflow profile scenarios, may be employed in order to obtain an even better match and consequently a better estimate of the inflow profile. However, depending on the situation, this may not be necessary.

FIG. 5 illustrates five different defined inflow scenarios denoted I to V of simulated BHP in a wellbore having two zones, zone 1 and zone 2. In zone 1, next to the toe (T), the length of uniform inflow has been chosen differently for the respective scenarios as indicated by the lines denoted by I to V. Zone 2 next to the heel (H) has been simulated as closed.

FIG. 6 a) to e) illustrate the comparison between simulated BHP for the respective scenarios defined in FIG. 5, denoted by the respective numerals I to V, and the collected field data for the BHP is indicated by F. As it is seen, the best match could possibly be the scenario denoted III illustrated in FIG. 6 c).

Figure 7:
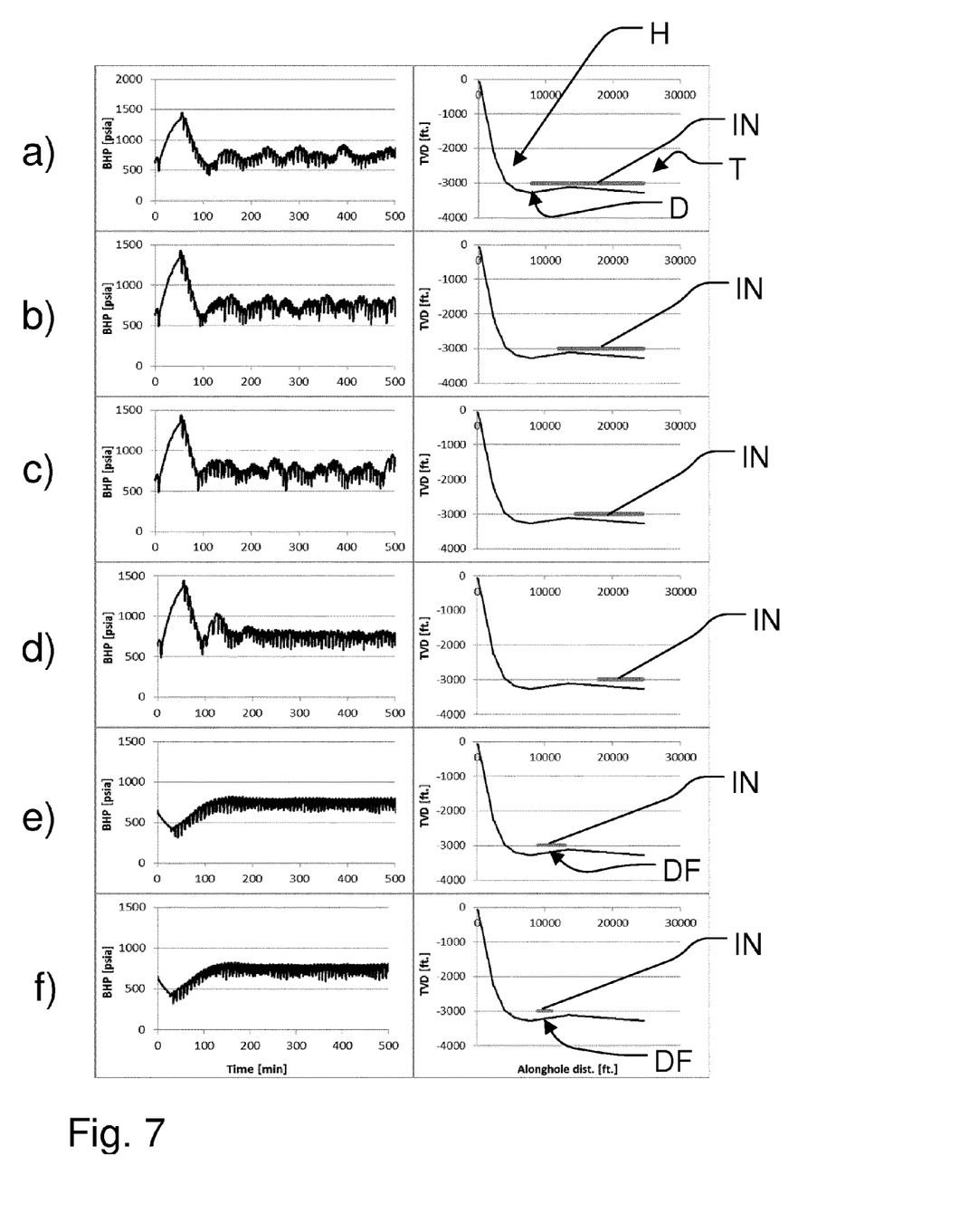
FIG. 7 illustrates an example of the simulation of Bottom Hole Pressure (BHP) for six different defined inflow scenarios.

FIG. 7 a) to f) illustrate an example of BHP (left) as function of time for six inflow intervals (right, interval denoted IN). The wellbore illustrated has heel (H), toe (T), dip (D) and downward flank (DF). Intervals of uniform inflow vary as follows: a) full length of dip-to-toe distance, b) upstream ⅔ of dip-toe length, c) upstream ½ of dip-toe length, d) upstream ⅓ of dip-toe length, e) full downward flank only and f) downstream-half of the downward flank.

Item

1. A method of estimating a well inflow profile along a section of a wellbore passing through a formation by collecting selected field data as a function of time during testing of a well and analysing the data, characterised by performing the following steps:

a) creating a dynamic simulation model taking into account modelling input at least in the form of the geometry of the well, such as diameters and/or deviation survey for the wellbore,
b) defining a number of different possible inflow profile scenarios,
c) simulating the defined inflow profile scenarios by means of the dynamics simulation model,
d) analysing the simulated inflow profile scenarios to describe characteristics of intermittent or slug flow behaviour in the form of selected modelling parameters as a function of time,
e) comparing the result of said analysis in the form of the selected modelling parameters as a function of time for each inflow profile scenario to the corresponding collected field data as a function of time and identifying the most likely inflow profile scenario on the basis thereof,
f) possibly repeating the above steps b) to e) by iteratively adjusting the defined inflow profile scenarios,
g) using the best obtained match between the result of said analysis and the collected field data as the estimated well inflow profile along the section of the wellbore.

2. A method according to item 1, whereby the selected modelling parameters of step d) above include at least one of the parameters pressure, temperature and flow behaviour.

3. A method according to item 1 or 2, whereby the selected modelling parameters of step d) above include any combination of:
Bottom hole pressure,
Bottom hole temperature,
Tubing head pressure,
Tubing head temperature,
Flow line pressure,
Flow line temperature,
Separator temperature,
Separator gas rate,
Separator oil rate,
Separator water rate,
Lift gas injection rate.

4. A method according to any one of the preceding items, whereby the characteristics of intermittent or slug flow behaviour according to step d) above are described by at least one of the parameters volume, velocity and frequency of the slugs.

5. A method according to any one of the preceding items, whereby the dynamic simulation model according to step a) above is created taking into account furthermore at least one of the following modelling inputs:
Fluid phase property models (such as for oil, gas, lift gas, and water),
Flow line geometry,
Separator setting and operational input,
Separator pressure,
Possibly further reservoir properties.

6. A method according to any one of the preceding items, whereby the collection of selected field data as a function of time during testing of the well is performed at least during steady state tests.

7. A method according to any one of the preceding items, whereby the collection of selected field data as a function of time during testing of the well is performed at least during step rate tests, whereby the flow rate is respectively increased and/or decreased.

8. A method according to any one of the preceding items, whereby the collected field data are analysed to recognise dominant frequencies in the frequency domain achieved from Fourier transform, wavelet analysis, or similar signal processing methods.

9. A method according to any one of the preceding items, whereby the shape of the temperature signals is analysed, preferably in the deviation range of less than approximately 0.028 degrees Celsius (0.05 degrees Fahrenheit), more preferred less than approximately 0.0056 degrees Celsius (0.01 degrees Fahrenheit), even more preferred less than approximately 0.0028 degrees Celsius (0.005 degrees Fahrenheit) and most preferred less than approximately 0.00056 degrees Celsius (0.001 degrees Fahrenheit).

10. A method according to any one of the preceding items, whereby the shape of the pressure signals is analysed, preferably in the deviation range of less than approximately 70,000 Pa (approximately 10 psi), more preferred less than approximately 35,000 Pa (approximately 5 psi), even more preferred less than approximately 7,000 Pa (approximately 1 psi), even more preferred less than approximately 700 Pa (approximately 0.1 psi) and most preferred less than approximately 70 Pa (approximately 0.01 psi).

The invention claimed is:

1. A method for efficiently operating a well, comprising:
estimating a well inflow profile along a section of a wellbore of a well passing through a formation, by:
collecting field data from a downhole gauge arranged between a reservoir section and a tubing head as a function of time during testing of the well,
analyzing the collected field data, which field data is only recorded downstream of the producing interval and measured at the position of the downhole gauge to obtain selected field parameters,
providing a created dynamic simulation model of the well inflow profile of the well based on at least the geometry of the well,
defining a number of different possible inflow profile scenarios,
simulating the defined inflow profile scenarios by means of the dynamic simulation model,
analyzing the simulated inflow profile scenarios to obtain characteristics of intermittent or slug flow behavior in the form of selected modelling parameters as a function of time,
comparing the selected modelling parameters as a function of time for each inflow profile scenario to the corresponding selected field parameters as a function of time and identifying the most likely inflow profile scenario on the basis thereof,
estimating the well inflow profile along the section of the wellbore based on the comparison of the selected modelling parameters as a function of time to the corresponding selected field parameters as a function of time to thereby select a manner in which to operate the well, and
operating the well according to the selected manner,
wherein estimating the well inflow profile according to the steps above obviates the need to run measurement tools into the well, which have high cost and which pose high operational risk.

2. The method according to claim 1, wherein the method comprises:
creating the dynamic simulation model taking into account modelling input at least in the form of the geometry of the well, such as diameters and/or deviation survey for the wellbore,
defining the number of different possible inflow profile scenarios, simulating the defined inflow profile scenarios by means of the dynamic simulation model,
analyzing the simulated inflow profile scenarios to obtain the characteristics of intermittent or slug flow behavior in the form of the selected modelling parameters as a function of time,
comparing the selected modelling parameters as a function of time for each inflow profile scenario to the corresponding selected field parameters as a function of time and identifying the most likely inflow profile scenario on the basis thereof,
by iteratively adjusting the defined inflow profile scenarios,
using the best obtained match between the result of said analysis and the collected field data as the estimated well inflow profile along the section of the wellbore.

3. The method according to claim 1, whereby the selected modelling parameters include at least one of the parameters pressure, temperature and flow behavior.

4. The method according to claim 1, whereby the selected modelling parameters include any combination of:
Bottom hole pressure,
Bottom hole temperature,
Tubing head pressure,
Tubing head temperature,
Flow line pressure,
Flow line temperature,
Separator temperature,
Separator gas rate,
Separator oil rate,
Separator water rate,
Lift gas injection rate.

5. The method according to claim 1, whereby the characteristics of intermittent or slug flow behavior are described by at least one of the parameters volume, velocity and frequency of the slugs.

6. The method according to claim 1, whereby the dynamic simulation model is created taking into account furthermore at least one of the following modelling inputs:
Fluid phase property models,
Flow line geometry,
Separator setting and operational input,
Separator pressure,
Possibly further reservoir properties.

7. The method according to claim 1, whereby the collection of selected field data as a function of time during testing of the well is performed at least during steady state tests.

8. The method according to claim 1, whereby the collection of selected field data as a function of time during testing of the well is performed at least during step rate tests, whereby the flow rate is respectively increased and/or decreased.

9. The method according to claim 1, whereby the collection of selected field data is performed downstream of the producing interval.

10. The method according to claim 1, whereby the collection of selected field data is performed at the tubing head.

11. The method according to claim 1, whereby the collected field data are analyzed to recognize dominant frequencies in the frequency domain achieved from Fourier transform, wavelet analysis, or similar signal processing methods.

12. The method according to claim 1, whereby the shape of the temperature signals is analyzed, preferably in the deviation range of less than 0.028 degrees Celsius (0.05 degrees Fahrenheit), more preferred less than 0.0056 degrees Celsius (0.01 degrees Fahrenheit), even more preferred less than 0.0028 degrees Celsius (0.005 degrees Fahrenheit) and most preferred less than 0.00056 degrees Celsius (0.001 degrees Fahrenheit).

13. The method according to claim 1, whereby the shape of the pressure signals is analyzed, preferably in the deviation range of less than approximately 70,000 Pa (10 psi), more preferred less than 35,000 Pa (5 psi), even more preferred less than 7,000 Pa (1 psi), even more preferred less than 700 Pa (0.1 psi) and most preferred less than 70 Pa (0.01 psi).

14. A system for efficiently operating a well, the system includes:
computer program storage; and
a processor in communication with the computer program storage, wherein the computer program storage stores a computer program executable by the processor for causing the processor to perform acts comprising:
estimating a well inflow profile along a section of a wellbore of a well passing through a formation by:
collecting field data from a downhole gauge arranged between a reservoir section and a tubing head as a function of time during testing of the well,
analyzing the collected field data, which field data is only recorded downstream of the producing interval and measured at the position of the downhole gauge to obtain selected field parameters,
providing a created dynamic simulation model of the well inflow profile of the well based on at least the geometry of the well,
defining a number of different possible inflow profile scenarios,
simulating the defined inflow profile scenarios by means of the dynamic simulation model,
analyzing the simulated inflow profile scenarios to obtain characteristics of intermittent or slug flow behavior in the form of selected modelling parameters as a function of time,
comparing the selected modelling parameters as a function of time for each inflow profile scenario to the corresponding selected field parameters as a function of time and identifying the most likely inflow profile scenario on the basis thereof,
estimating the well inflow profile along the section of the wellbore based on the comparison of the selected modelling parameters as a function of time to the corresponding selected field parameters as a function of time to thereby select a manner in which to operate the well, wherein the well is subsequently operating according to the selected manner
wherein estimating the well inflow profile according to the acts above obviates the need to run measurement tools into the well, which have high cost and which pose high operational risk.

15. A computer program comprising program code means for performing the steps of claim 1.

16. The method according to claim 1, wherein the inflow profile is estimated based entirely on measurements made outside of the producing interval.

* * * * *

UNITED STATES PATENT AND TRADEMARK OFFICE
CERTIFICATE OF CORRECTION

PATENT NO. : 10,353,112 B2
APPLICATION NO. : 15/327220
DATED : July 16, 2019
INVENTOR(S) : Jens Henrik Hansen Page 1 of 1

It is certified that error appears in the above-identified patent and that said Letters Patent is hereby corrected as shown below:

On the Title Page

In (71) Applicant, delete "Maersk Olie og Gas A/S, Kopenhavn K (DK)" and replace with --Total E&P Danmark A/S, Kobenhaven Ø (DK)--

In (72) Inventor, delete "Kobenhavn K" and replace with --Kobenhavn Ø--

Signed and Sealed this
Eighth Day of December, 2020

Andrei Iancu
*Director of the United States Patent and Trademark Office*